United States Patent [19]

Asakura et al.

[11] Patent Number: 4,831,324
[45] Date of Patent: May 16, 1989

[54] METHOD AND APPARATUS FOR ANALYZING THE ELECTRODE INPEDANCE

[75] Inventors: Yamato Asakura, Katsuta; Masao Endo, Hitachi; Shunsuke Uchida, Hitachi; Masami Matsuda, Hitachi; Kazumichi Suzuki, Mito, all of Japan

[73] Assignee: Hitachi, Ltd., Tokyo, Japan

[21] Appl. No.: 26,258

[22] Filed: Mar. 16, 1987

[30] Foreign Application Priority Data

Mar. 20, 1986 [JP] Japan ................................. 61-60576

[51] Int. Cl.[4] ........................................... G01R 27/00
[52] U.S. Cl. ................................. 324/57 R; 204/1 T; 204/404; 324/712; 324/57 SS
[58] Field of Search ................ 324/57 R, 57 SS, 438, 324/439, 444, 446, 449, 57 Q, 71.2, 65 R, 65 CR, 62; 204/404, 1 T, 406

[56] References Cited

U.S. PATENT DOCUMENTS

| 4,087,658 | 5/1978 | Hoppough | 324/57 SS X |
| 4,238,298 | 12/1980 | Tsuru et al. | 324/57 R X |
| 4,510,437 | 4/1985 | Iskander | 324/61 R |
| 4,626,338 | 12/1986 | Kondo et al. | 204/406 |

OTHER PUBLICATIONS

Ebersberger, "Impedance Matching Measurements with Sweep Generator Assembly Polyskop III SWOB." News From Rohde & Schwartz vol. 12, No. 53(1972) pp. 19–23.

Benadda et al, "A Measuring Device for the Determination of the Electric Permittivity of Materials in the Frequency Range 0.1–300 Mhz." J. Phys. E: Sci. Instrum vol. 15, No. 1 (Jan. 1982) pp. 32–36.

Primary Examiner—Reinhard J. Eisenzopf
Assistant Examiner—Robert W. Mueller
Attorney, Agent, or Firm—Antonelli, Terry & Wands

[57] ABSTRACT

A method and apparatus for analyzing the electrode impedance, in which an a.c. voltage with its frequency varied at intervals is applied between a pair of measuring electrodes dipped in the sample liquid, the complex a.c. impedance between the electrodes is measured at each frequency, the maximum value among absolute values of imaginary part of the measured impedance values is detected as the electrode polarization resistance, and the solution resistance of the liquid is calculated by subtracting the detected maximum value from the real part of the impedance corresponding to the maximum imaginary part.

8 Claims, 9 Drawing Sheets

TEMPERATURE OF WATER (°C)

METHOD AND APPARATUS FOR ANALYZING THE ELECTRODE INPEDANCE

BACKGROUND OF THE INVENTION

This invention relates to a method and apparatus for monitoring the quality of liquid such as aqueous solution, and more particularly to a method and apparatus for electrode impedance analysis suitable for the direct monitoring of impurity ions in hot pure water in the primary system of a nuclear reactor.

Liquid, e.g., water, is an influential factor for the corrosion of a construction such as a nuclear reactor. One of water quality parameters indicating the degree of influence on corrosion is the conductivity of water. It is generally known that the presence of acid, neutral or alkaline impurity ions in hot water is influential on corrosion. The conductivity of water which represents the state (dissociation) of impurity ions in hot water is measured conventionally at the room temperature after the hot water has been cooled and decompressed. However, because of different temperature dependencies of the dissociation of water, dissociation of impurities and mobility of ions, it is difficult to evaluate accurately the conductivity of hot water from the conductivity of water measured at the room temperature. On this account, the hot water oriented conductivity measuring apparatus has been an indispensable mean for the quick and accurate monitoring of the hot water conductivity. Room temperature oriented conductivity measuring apparatus available in the market employ the a.c. bridge system which measures the solution resistance from the resistance between two pieces of platinum electrodes dipped in the water under measurement with an a.c. voltage with a constant frequency around 10 kHz being applied between the electrodes, and this system is also used for the measurement of the hot water conductivity. However, the a.c. bridge system when used for the hot water conductivity measurement provides a poor repeat rate for measurement results, and resulting data has a disparity of around ±50% at temperatures above 150° C.

The major causes of disparity in the hot water measurement results are conceivably the temperature change in the resistive component due to the oxidizing and reducing reactions taking place on the interface between the platinum electrodes and water, hereinafter referred to as polarization resistance, and the temperature change in the electrical capacitive component caused by the ion adsorption layer at the interface. As a method for strictly separating and analyzing the solution resistance component between electrodes, necessary for the analysis of the above-mentioned polarization resistance component, electrical capacitance component and conductivity, there is known the a.c. impedance analysis method. The conventional method and apparatus for the a.c. impedance analysis are disclosed in an article entitled "Identification of Electrochemical Processes by Frequency Response Analysis", Technical Report No. 004/83, pp. 30-31, published in August 1984 by Solartron Instruments.

In the a.c. impedance analysis method, the frequency response of the electrode impedance is measured by application of an a.c. voltage with a frequency range from a sufficiently low frequency to a sufficiently high frequency between electrodes dipped in the water under measurement, and the polarization resistance and solution resistance are evaluated separately from the electrode impedance at zero and infinite frequencies of the application voltage, respectively.

However, the a.c impedance analysis method when used in a practical water quality monitor takes a longer measurement time for the analysis of a low frequency region, and difficulty of quick measurement is a shortcoming of this method. Another problem is a significant increase in the capacitive and inductive impedance of the lead lines between the apparatus and electrodes relative to the electrode impedance to be measured in the analysis of a high frequency region, and this can be a cause of inferior measurement accuracy. Furthermore, the solution resistance itself is rendered highly frequency dependent in the high frequency region above 1 MHz, meaning a change in the solution resistance itself in the high frequency region, as described in publication "GENDAI DENKI KAGAKU", p. 39, by Tamura et al., Baifukan.

SUMMARY OF THE INVENTION

An object of this invention is to provide a method and apparatus for electrode impedance analysis capable of analyzing the electrode impedance accurately and quickly and measuring the solution resistance or/and electrode polarization resistance separately basing on the result of analysis.

The inventors of this invention noticed the fact that when two pieces of measuring electrodes of the same design are dipped in the liquid under measurement face to face with a certain spacing provided therebetween and with a variable frequency a.c. voltage applied between the electrodes and the complex a.c. impedance of the electrodes is measured by varying the frequency of the application voltage, the plot of the measured complex impedance values at respective frequencies forms a virtually true semicircle or part of it on the complex plane over a wide temperature range from the room temperature to 300° C. Based on this fact, the complex a.c. impedance in a medial frequency band is measured to make inference of the a.c. impedance at a zero frequency or infinite frequency, and from the inference result the inter-electrode solution resistance or/and electrode polarizing resistance are evaluated.

Specifically, complex a.c. impedance values are measured sequentially at medial frequencies between zero and infinity. The maximum absolute value of the imaginary part $|Im[Z]|$ max among the complex a.c. impedance values is determined as the electrode polarization resistance, the value of the real part $Re[Z]$ at the maximum imaginary part is measured and it is subtracted by $|Im[Z]|$ max to evaluate the interelectrode solution resistance. This a.c. impedance analysis method eliminates the need of analysis in a low frequency region, and allows drastic reduction of measurement time needed for the a.c. impedance analysis. In addition, the absence of need for the analysis in a high frequency region eliminates the need of countermeasures against high-frequency noises, whereby the analyzer can be simplified.

DESCRIPTION OF THE PREFERRED EMBODIMENT

Figure 1:
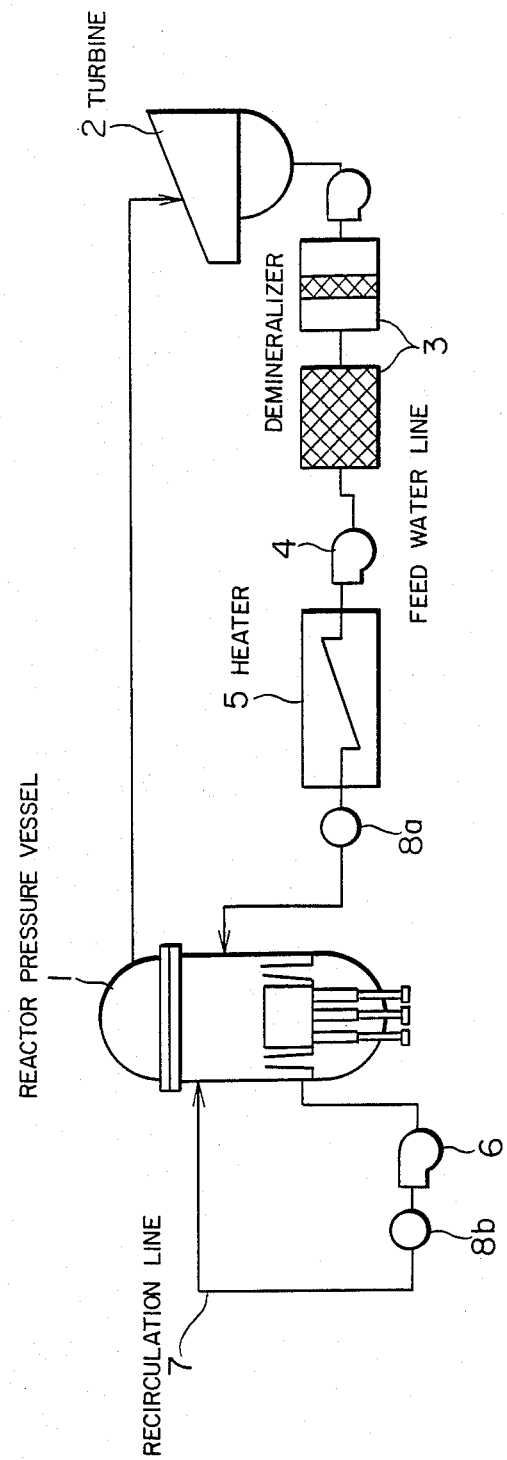
FIG. 1 is a schematic diagram showing the primary system and other principal portions of a nuclear reactor in a nuclear power plant to which the present invention is applied.

FIG. 1 shows the application of the present invention to the measurement in a nuclear power plant, and the arrangement shown in the figure is the primary cooling system and other principal components of a nuclear reactor, e.g., boiling-water reactor (BWR). Components shown in the figure include a reactor pressure vessel 1, a turbine 2, a demineralizer 3, a feed water pump 4, a feed water heater 5, a recirculation pump 6, a recirculation line 7, and electrode impedance measuring apparatus according to this invention for measuring the conductivity of feed water and reactor water and also the corrosion rate of the electrode material. The inventive electrode impedance measuring apparatus applied to the nuclear power plant for measuring the conductivity of hot feed water and hot reactor water in the feed water system and recirculation system enables accurate diagnosis for the water quality by inspecting the behavior of impurities in the hot water, thereby further enhancing the reliability of the nuclear power plant.

Figure 2:
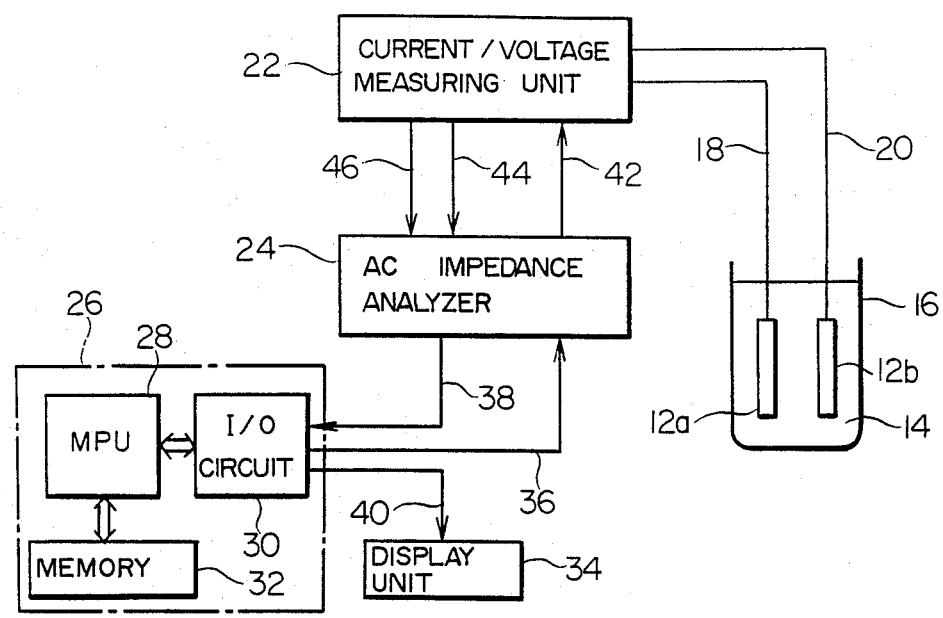
FIG. 2 is a block diagram of the electrode impedance analyzer according to the present invention.

FIG. 2 shows in block diagram a typical electrode impedance analyzer according to this invention. In the figure, symbols 12a and 12b denote two pieces of planar measuring electrodes made of platinum for example. Instead of the planar shape for the electrodes 12a and 12b, one electrode may be a rod electrode surrounded coaxially by another cylindrical electrode. Symbol 14 denotes a liquid sample under measurement, and it is the feed water or reactor water when the invention is applied to a nuclear power plant as shown in FIG. 1. Other components shown include lead lines 18 and 20 for applying a measuring a.c. voltage to the electrodes 12a and 12b, a current/voltage measuring unit for measuring the current and voltage between the electrodes, an a.c. impedance analyzer 24 for measuring the a.c. impedance between the electrodes, a computational unit 26 for calculating the electrode polarization resistance and/or inter-electrode solution resistance, and a display unit, e.g., CRT unit, 34 for displaying the calculation results provided by the computational unit 26. The current/voltage measuring unit 22 and a.c. impedance analyzer 24 are known apparatus as described in the above-cited publication "Identification of Electrochemical Processes by Frequency Response Analysis" by Solartron Instruments. The computational unit 26 consists mainly of a microprocessor unit 28, ROM an RAM memory 32, and input/output circuit 30. The computational unit 26 supplies a frequency command signal through its input/output circuit 30 and line 36 to the a.c. impedance analyzer 24, which in turn produces an a.c. voltage with certain magnitude, e.g., 0.1 volt, and with a frequency compliance with the frequency command signal, and the voltage is applied to the measuring electrodes 12a and 12b by way of the line 42, current/voltage measuring unit 22 and lines 18 and 20.

The current/voltage measuring unit 22 measures the application a.c. voltage supplied through the line 42 and the a.c. current flowing between the electrodes through the lines 18 and 20, and imparts the measured values to the a.c. impedance analyzer 24 over the lines 44 and 46. The analyzer 24 calculates the complex a.c. impedance between the electrodes basing on the measured current and voltage values, and imparts the calculation result to the computational unit 26 over the line 38. The computational unit 26 calculates at least one of the electrode polarization resistance component, electrical capacitance component and inter-electrode solution resistance component basing on the calculated complex a.c. impedance, and operates on the display unit 34 to display the computational results.

Figure 3A:
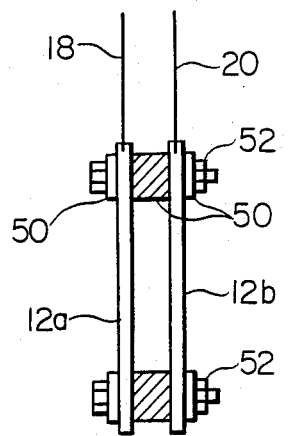
FIGS. 3A and 3B are diagrams showing the side view and front view of the measuring electrode set in FIG. 2.
Figure 3B:
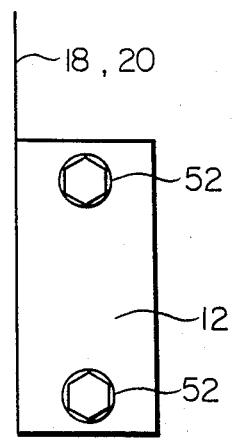

FIGS. 3A and 3B are a side view and a front view of the measuring electrode set. It consists of planar electrodes 12a and 12b made of platinum, for example, in the same shape and same surface condition juxaposed with a constant spacing in the range of 2-12 mm and fixed together by bolts 52 through insulation spacers 50 made of PTFE, ceramic or the like.

The principle of the inventive method will be described prior to electrode impedance analysis using the analyzer shown in FIG. 2. The electrode set shown in FIGS. 3A and 3B are dipped in two kinds of pure water at 15° C. and 300° C. with an a.c. voltage of approximately 0.1 volt and variable frequency of 1 Hz to 100 kHz being applied between the electrodes, and the complex a.c. impedance between the electrodes is measured with the analyzer 24. The results are plotted on the complex plane as shown in FIGS. 4A and 4B, in which coordinates Im[Z] and Re[Z] represent the imaginary part and real part of the complex a.c. impedance.

Figure 4A:
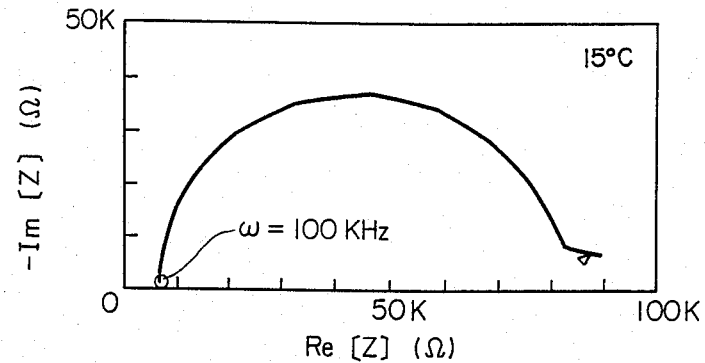
FIGS. 4A and 4B are graphs showing the frequency response of the electrode impedance of platinum electrodes dipped in pure water, plotted on the complex plane in a frequency range from 1 Hz to 100 kHz.
Figure 4B:
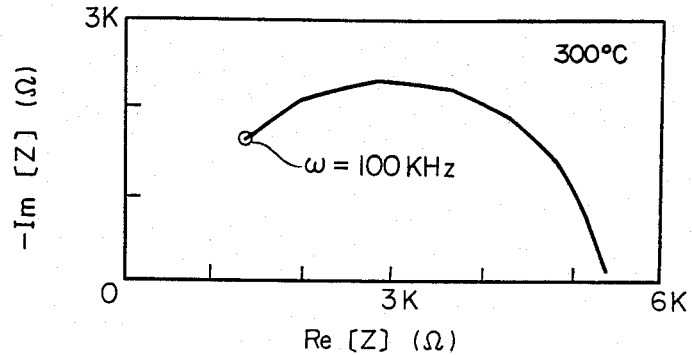

From the measurement results of FIGS. 4A and 4B, the inventors noticed the following facts.

Figure 5:
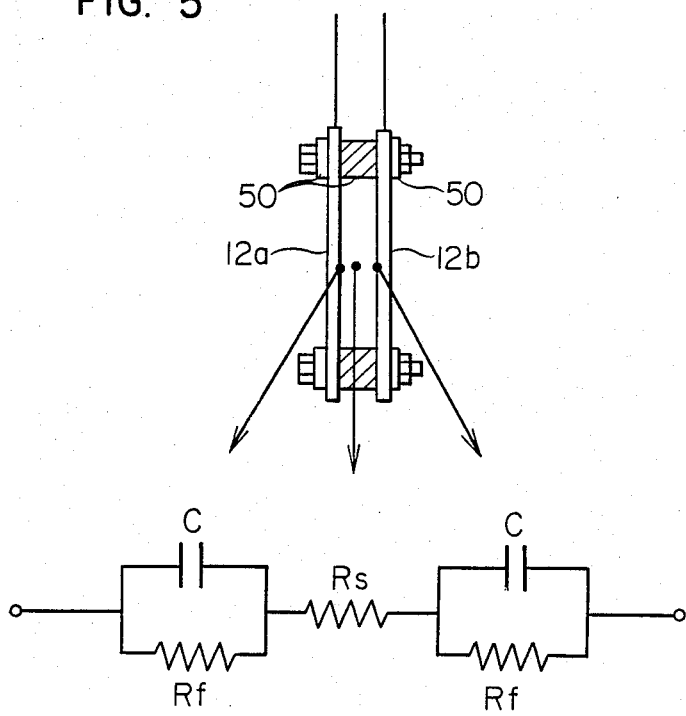
FIG. 5 is a diagram showing an electrical equivalent circuit of the measuring electrode set.

(1) The electrode set can be expressed by an equivalent circuit shown in FIG. 5 in the temperature range from the room temperature to 300° C. Using the equivalent circuit of FIG. 5, where Rf is the electrode polarization rssistance, C is the electrode capacitance, and Rs is the solution resistance, the complex a.c. impedance Z and the frequency $\omega_{max}$ making Im[Z] maximum are expressed as follows.

$$Z = Rs + 2Rf/(1 + j\omega C\,Rf) \tag{1}$$

$$\omega_{max} = 1/C\,Rf \tag{2}$$

Figure 6:
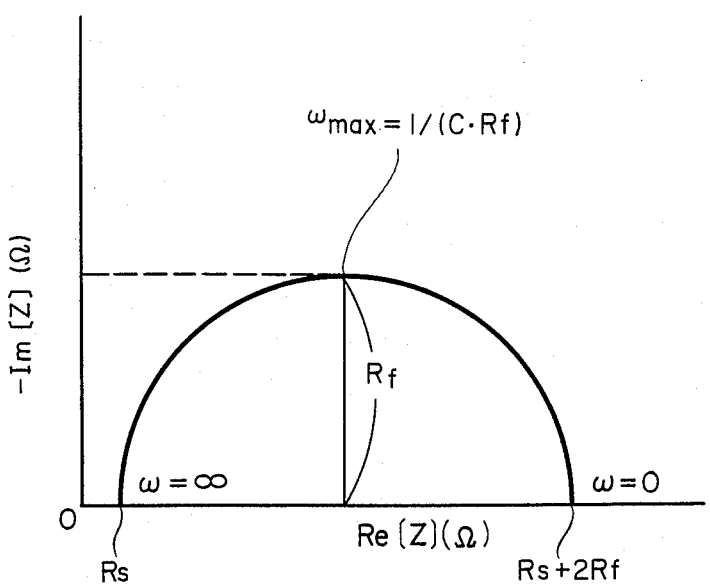
FIG. 6 is a graph showing the frequency response of the theoretical complex a.c. impedance of the measuring electrode set given as the equivalent circuit of FIG. 5.

(2) The frequency characteristics of the complex a.c. impedance calculated using the equivalent circuit of FIG. 5 and plotted on the complex plane form a locus of semicircle as shown in FIG. 6. From the graph, the complex a.c. impedance Z at infinite and zero frequencies of the electrode application voltage has values of Rs and Rs+2Rf, respectively.

Figure 7:
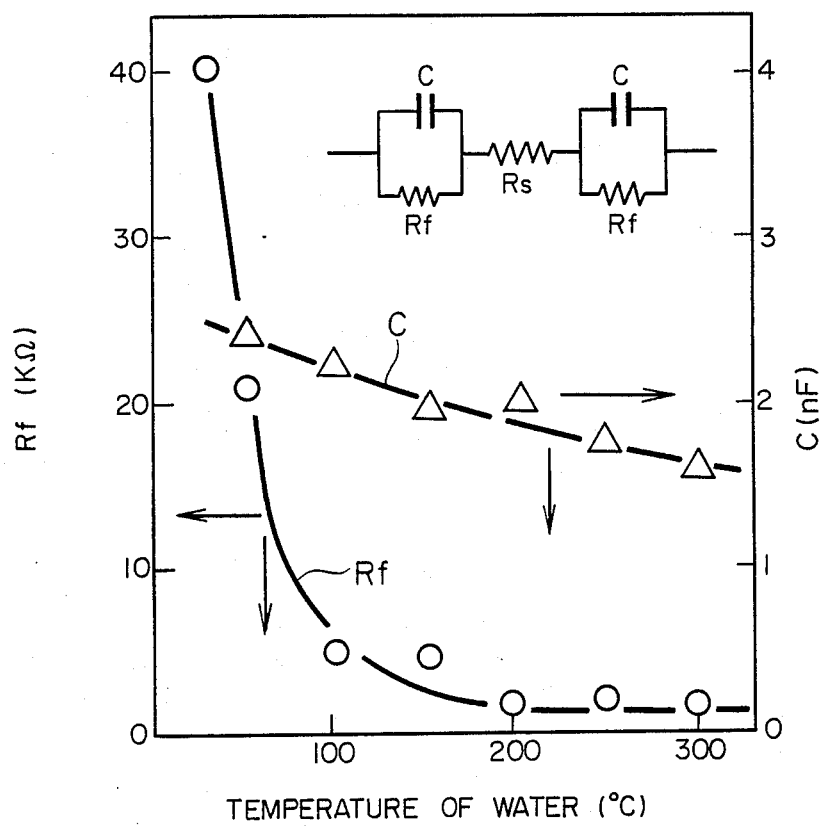
FIG. 7 is a graph showing the temperature dependencies of the electrode polarization resistance and electrode capacitance.

(3) The electrode polarization resistance Rf and electrode capacitance C which are directly attributable to electrode polarization are highly temperature dependent as shown in FIG. 7. Accordingly, the frequency for the direct determination of the solution resistance Rs (i.e., the intersection of the locus with the real axis in FIG. 6) goes higher as the temperature rises.

In view of the above examination results, it is infeasible for the case of a high liquid temperature to determine the value of Rs through the inference of the intersection of the locus with the real axis on the complex plane of FIG. 6 using a frequency as low as around 10 kHz used in the conventional solution resistance measurement. On the other hand, use of a high frequency above 100 kHz imposes the following problems in impedance analysis. These are the significant increase in the impedance noise caused by the capacitive and inductive components of the lead lines 18 and 20 connecting the electrode set to the analyzer, and the significant frequency dependency of the solution resistance.

The inventors paid attention to the fact that the locus of frequency characteristics of the electrode impedance can be approximated on the complex plane by a true semicircle or part of it having a radius of Rf over the temperature range from the room temperature to 300° C., and noticed that the values of electrode impedance at $\omega = 0$ and infinity can be inferred in a sufficient accuracy from part of the locus. In a specific process, values of complex a.c. impedance at medial frequencies between zero and infinity are measured sequentially to determine the electrode polarization resistance Rf from the maximum absolute value of the imaginary part |Im[Z]|max, and evaluate the real part Re[Z] of the complex a.c. impedance at the maximum imaginary part, and the solution resistance between the electrodes is determined by inference from Re[Z]-|Im[Z]|max.

Figure 8A:
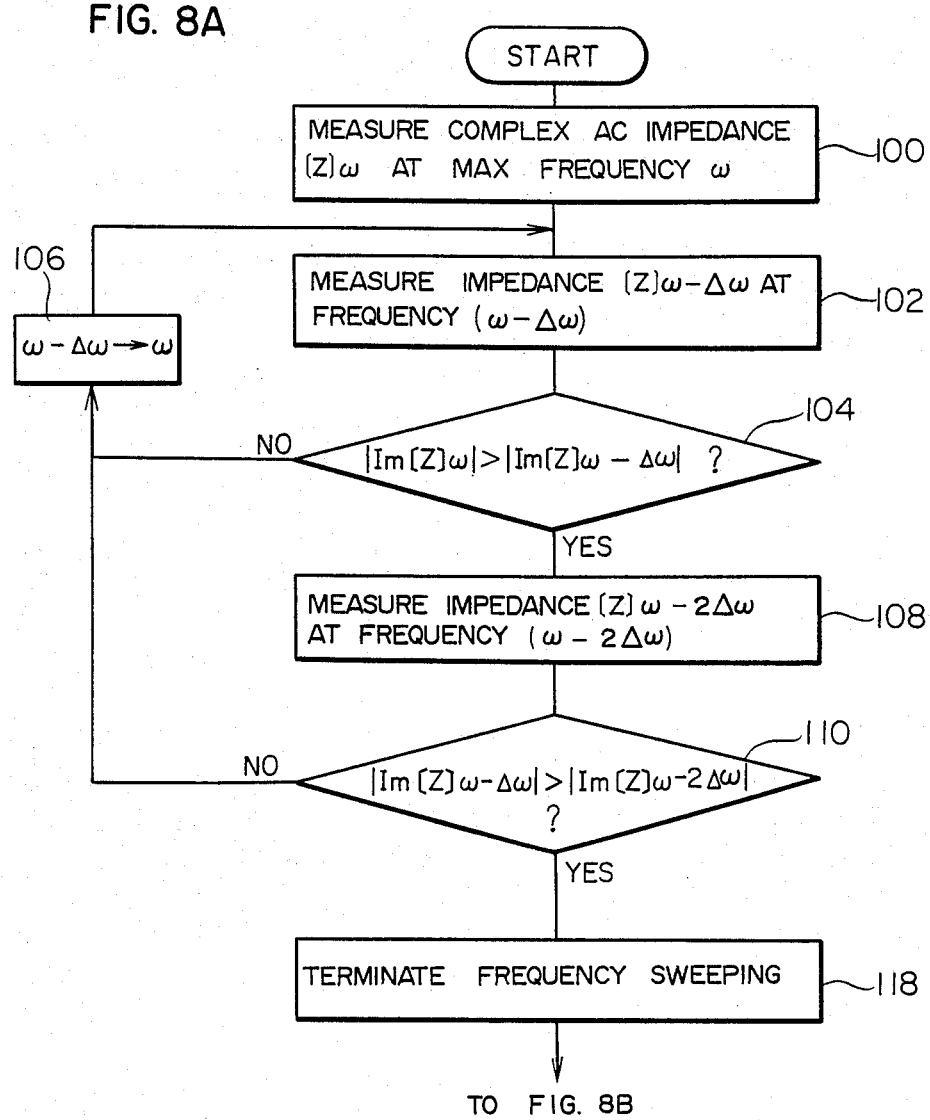
FIGS. 8A and 8B are flowcharts explaining the operation of the inventive electrode impedance analyzer.
Figure 8B:
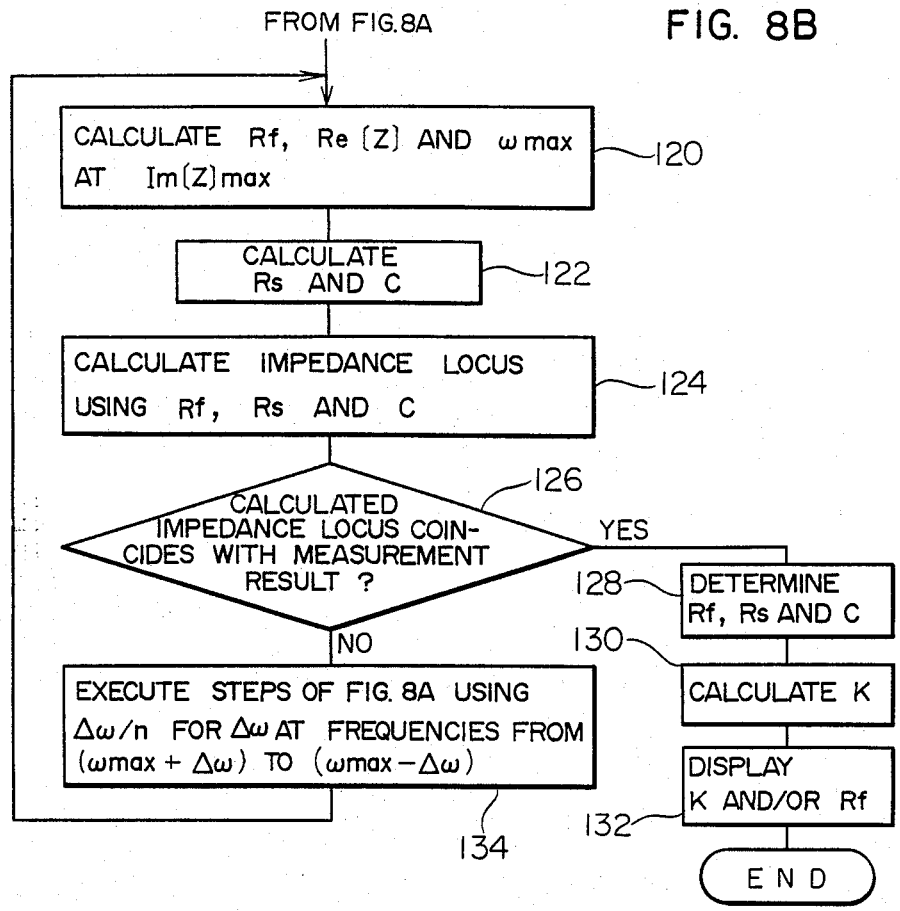

The inventive electrode impedance analysis method and apparatus based on the foregoing principle will be described with reference to FIG. 2 and FIGS. 8A and 8B. The system operation shown by the flowchart of FIGS. 8A and 8B is implemented by a program stored in a ROM memory within the computational unit 26. In the embodiment of this invention, the measuring frequency is swept from higher to lower frequencies, since the impedance measuring time is shorter at the higher frequency region and the maximum absolute value of the imaginary part can fast be detected.

In the first step 100, the microprocessor unit 28 issues a frequency command signal indicative of the maximum frequency $\omega$ to the a.c. impedance analyzer 24 by way of the input/output circuit 30. The maximum frequency $\omega$ is that at which the impedance noise caused by the capacitive and inductive components of the lead lines 18 and 20 is negligibly little, and it is preferably 100 kHz. With an a.c. voltage with the frequency $\omega$ being applied between the electrodes, the a.c. impedance analyzer 24 measures the complex a.c. impedance [Z]$\omega$ and the absolute value of its imaginary part |Im[Z]$\omega$| and the value of real part Re[Z]$\omega$ are stored in the RAM part of the memory 32.

In the next step 102, the computational unit 26 issues a frequency command signal indicative of a frequency $\omega - \Delta\omega$ to measure the complex a.c. impedance [Z]$\omega-\Delta\omega$, and the resulting Im[Z]$\omega-\Delta\omega$ and Re[Z]$\omega-\Delta\omega$ are stored in the RAM. The frequency decrement $\Delta\omega$ is selected to be 10 kHz (i.e., 100 kHz×1/10) in the range of $\omega$ between 100 kHz and 10 kHz, and 1 kHz (i.e., 10 kHz×1/10) between 10 kHz and 1 kHz.

In the next step 104, the absolute values of imaginary part of complex a.c. impedance at frequencies $\omega$ and $\omega-\omega$, Im[Z]$\omega$ and Im[Z]$\omega-\leftarrow\omega$, are retrieved from the RAM and compared with each other, and if the latter is smaller than the former, the sequence proceeds to step 108; otherwise the sequence proceeds to step 106. The step 106 substitutes the value of $\omega-\Delta\omega$ for $\omega$, so that the impedance [Z]$\omega-\Delta\omega$ is measured in step 102.

These steps 102-106 are repeated until the absolute value of imaginary impedance |Im[Z]$\omega-\Delta\omega$| at frequency $\omega-\Delta\omega$ becomes smaller than the counterpart |Im[Z]$\omega$| at frequency $\omega$. By this processing, the maximum imaginary impedance |Im[Z]|max is assumed to be |Im[Z]$\omega$| if the absolute value of imaginary part changes from increase to decrease during a frequency sweep from the maximum frequency to a low frequency and it is judged to be "Yes" at step 104. Then, if it is judged to be "Yes" at step 104, the absolute value of imaginary part |Im[Z]$\omega$| and the real part of the complex a.c. impedance at $\omega$ are detected and store in the RAM.

Figure 9:
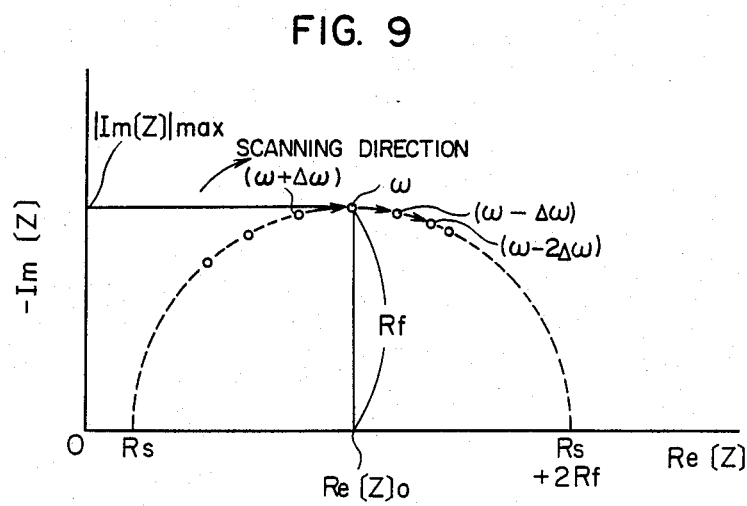
FIG. 9 is a graph showing the frequency response of the complex a.c. impedance resulting from the measurement according to the inventive electrode impedance analysis method.

When step 104 provides an affirmative result, the following step 108 redundantly measures the impedance [Z]$\omega-2\Delta\omega$ at a frequency $\omega-2\Delta\omega$, the next step 110 compares the absolute values of imaginary part at $\omega-\Delta\omega$ and $\omega-2\Delta\omega$, and if |Im[Z]$\omega-\Delta\omega$| is larger than |Im[Z]$\omega-2\Delta\omega$|, the sequence proceeds to step 118 to terminate the frequency sweeping operation. It is obvious from the result of complex a.c. impedance measurement according to this invention, as illustrated in FIG. 9, that the absolute value of Im[Z] is determined to have a peak between frequencies $\omega+\Delta\omega$ and $\omega-\Delta\omega$. In this embodiment of the invention, |Im[Z]| has a peak at frequency $\omega$, namely, it is determined that |Im[Z]| has its peak value |Im[Z]| max equal to |Im[Z]$\omega$|.

If, on the other hand, step 110 reveals that |Im[Z]$\omega-\Delta\omega$| is not larger than |Im[Z]$\omega-2\Delta\omega$|, it is determined that the impedance measurement result at $\omega-2\Delta\omega$ is erroneous. In this case, the sequence returns to step 106, and steps 102-110 are repeated until the peak of |Im[Z]| is found.

Following the frequency sweep termination in step 118, the sequence proceeds to step 120 in which the real part of the complex a.c. impedance at $\omega$, i.e., Re[Z]o, corresponding to the |Im[Z]|max is retrieved from the RAM. The Re[Z]o is expressed as |Im[Z]|max+Rs. The |Im[Z]|max represents the electrode polarization resistance Rf. Accordingly, Rs is equal to Re[Z]o−Rf.

In the next step 122, the computational unit 26 calculates the electrode capacitance C by setting $\omega_{max}=\omega$ and the value for Rf in Equation (2), and also calculates the value of Rs from equation Rs=Re[Z]o−Rf.

The next step 124 sets the values of Rs and Rf obtained in steps 120 and 122 in Equation (1) to calculate theoretical values of complex a.c. impedance Zc at frequencies $\omega$, $\omega - \Delta\omega$, $\omega - 2\Delta\omega$, and so on. These theoretical values Zc at all measuring frequencies are compared with corresponding measured values Z stored in the RAM, and if all comparison results reside within a 5% difference, indicating a virtual consistency between the calculated and measured values, the values of Rf, Rs and C obtained in steps 120 and 122 are determined to be correct (step 128).

In the subsequent step 130, the conductivity K of the sample liquid is calculated using the value of Rs determined in step 128. The conductivity K is expressed as follows.

$$K = (1/Rs) \cdot (L/A) \quad (3)$$

where L is the distance between the electrodes, and A is the area of the electrode surface. Since the value L/A is constant regardless of the temperature, it can be obtained in advance from the known value of K and the value of Rs measured at the room temperature. Accordingly, the conductivity K is calculated using the known value of L/A and the value of Rs determined in step 128.

The resulting values of K and Rf are displayed in step 126 on the display unit 34. The conductivity K may be replaced with Rs o the display.

If, on the other hand, step 126 detects a difference of more than 5% between the calculated and measured values of complex a.c. impedance at one or more frequencies, they are determined to be conflicting. Namely, the peak value of imaginary part, $|Im[Z]|max$, of the complex a.c. impedance Z determined in step 120 is judged to be erroneous, and the complex a.c. impedance is measured in a frequency range between $\omega_{max} + \Delta\omega$ and $\omega_{max} - \Delta\omega$, where the correct peak value is presumed to reside, at a frequency interval of $\Delta\omega/n$, where n takes 10 for example. Namely, the steps of FIG. 8A are executed by substituting $\Delta\omega/10$ for $\Delta\omega$ and $\omega$ for $\omega_{max} + \Delta\omega$ so that the complex a.c. impedance is measured at a closer interval of $\Delta\omega/10$ between $\omega_{max} + \Delta\omega$ and $\omega_{max} - \Delta\omega$, thereby obtaining a correct absolute value of imaginary part $|Im[Z]|max$ and its frequency $\omega_{max}$.

Although step 134 has been explained to compare the calculated and measured values of complex a.c. impedance, the comparison process may be implemented only at some of these frequencies.

Figure 10:
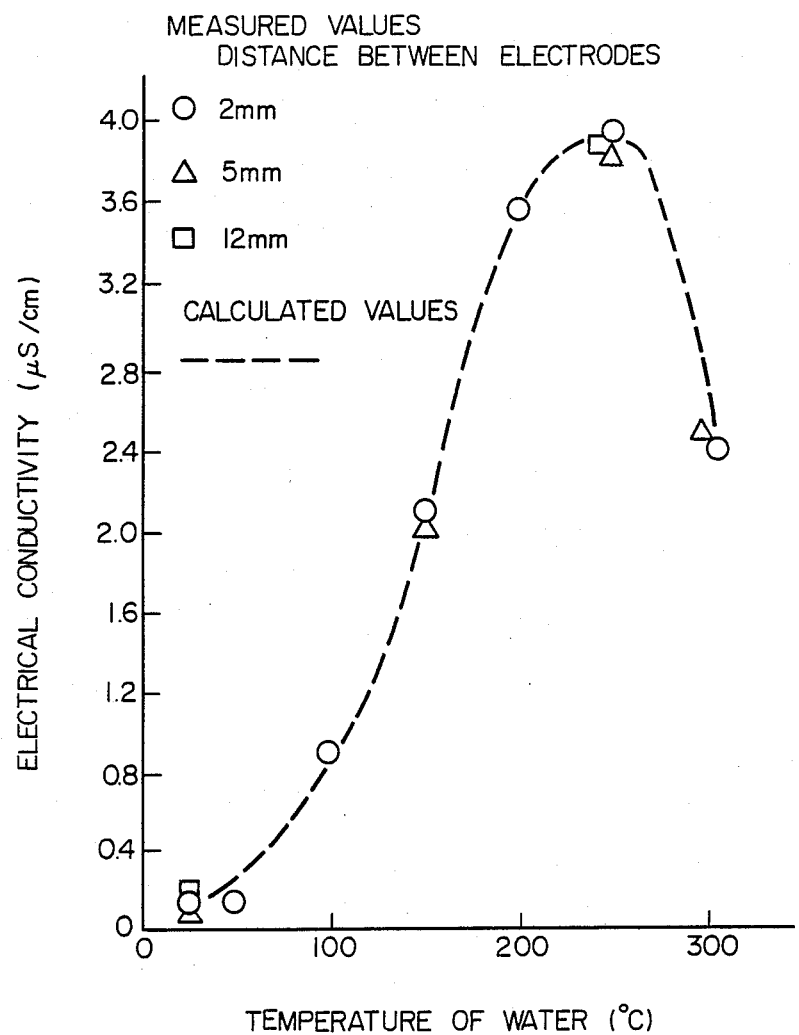
FIG. 10 is a graph showing the results of measurement and theoretical calculation when the present invention is applied to the measurement of conductivity of pure water.

FIG. 10 shows in graph the temperature dependency of the conductivity of pure water measured according to the inventive analyzing method and apparatus and that resulting from the theoretical calculation based on the dissociation of water. As shown by the graph, the measured and theoretical values are highly consistent in the entire range from the room temperature to 300° C. The difference between both results is within 35 5% over the temperature range. It was confirmed that the conductivity of pure water can be measured accurately with any electrode spacing of 2 mm, 5 mm and 12 mm.

Application of this invention to the nuclear power plant shown in FIG. 1 enables accurate evaluation of the dissociation of impurities in hot water in the feed water system and reactor water system, which results in an enhanced accuracy of water quality diagnosis, whereby the reliability of the plant operation is improved.

Beside the nuclear power plant, the present invention can of course be applied to chemical plants and the like, and there are no restrictions imposed on the sample liquid to be measured and the material of electrode.

Although in the above embodiment platinum is used for the electrode material, other noble metals can also be used to achieve the measurement of conductivity of liquid. Furthermore, metals other than noble metals or metallic compounds can also be used, and in this case the corrosion rate of the metal or metallic compound used can be analyzed on an online basis. Namely, when a metal other than noble metals or a metallic compound is used, the electrode polarization resistance Rf shown in FIG. 5 is equal to the corrosion resistance Rcorr. Generally, the corrosion rate Vcorr of an electrode material is inversely proportional to the corrosion resistance. Accordingly, by measuring the variation of Rcorr, the variation of Vcorr can be monitored accurately in a short time. It is also made possible the monitoring of the corrosion rate of electrode material in hot water which has been infeasible for the conventional measuring technique. In the foregoing embodiment of this invention, the corrosion rate is revealed indirectly by reading out the value of Rf on the display unit in step 132.

Figure 11:
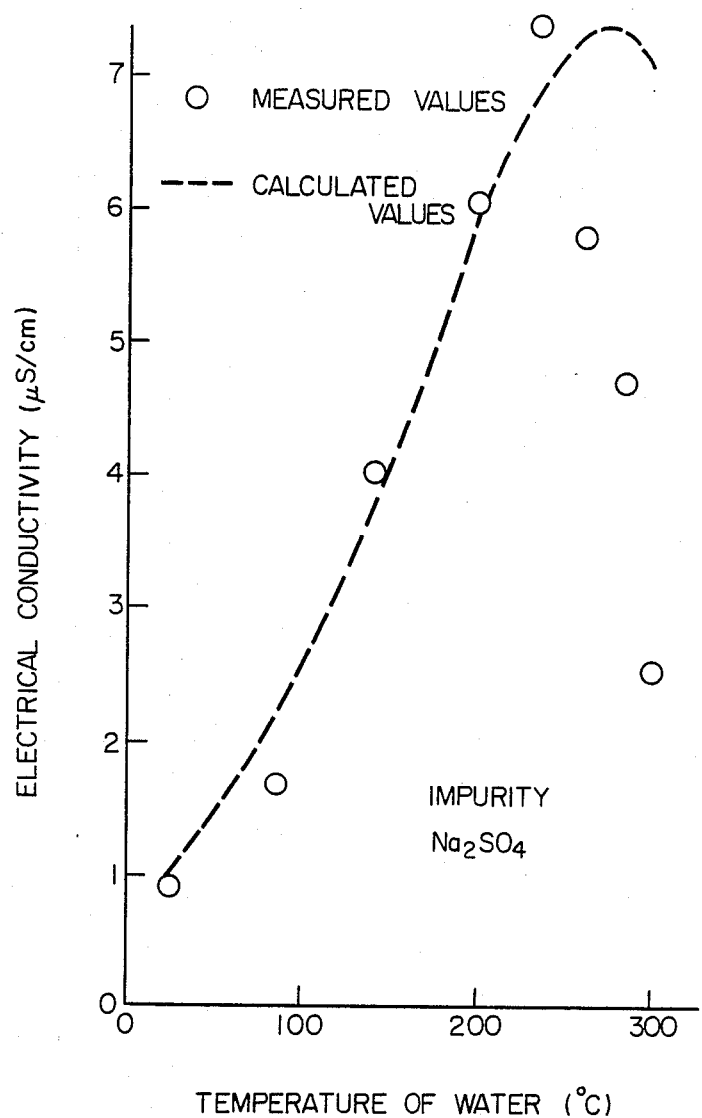
FIG. 11 is a graph showing the results of measurement and theoretical calculation when the present invention is applied to the measurement of conductivity of aqueous solution including impurity.

Next, the present invention is applied to the measurement of conductivity of aqueous solution including impurity, e.g., $Na_2SO_4$. FIG. 11 shows the results of measurement (shown by marks "o") and theoretical calculation (shown by dashed curve) of the conductivity of the impure water plotted against the temperature.

The dotted line shows the calculated result using the values of limiting molar conductivity of $Na^+$ and $SO_4^{2-}$ as well as $H^+$ and $OH^-$. In the calculation, perfect dissociation of $Na_2SO_4$ into $Na^+$ and $SO_4^{2-}$ was assumed. Calculated results show a good agreement with the measurement at the temperature less than 200° C. But above 200° C., the difference between calculation and measurement becomes remarkable. That is, the measured conductivity shows its maximum at about 230° C., while the calculated one increases monotonously with temperature. This difference suggests that the assumption of perfect dissociation of $Na_2SO_4$ can not be applicable at the temperature above 200° C. These results show that the direct measurement of electrical conductivity of high temperature water is useful for precise estimation of water qualities especially in the nuclear electric power plants.

Figure 12:
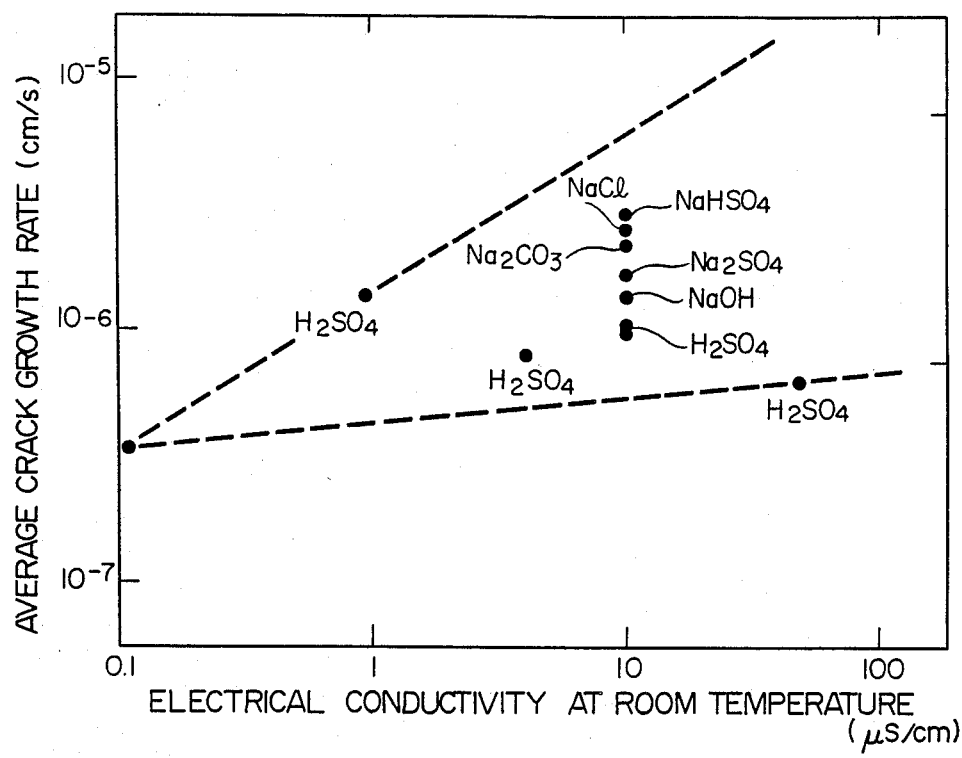
FIG. 12 is a graph showing the relation between the average crack growth rate of a metallic material and the conductivity of an aqueous impurity solution at the room temperature.

Next, effects of aqueous impurities on intergranular stress corrosion cracking of metallic materials will be examined. Water feed pipes in a nuclear power plant, for example, are corroded by impure water running in the pipes. FIG. 12 shows the experimental result for the relation between the average crack growth rate of a hot water feed pipe and the conductivity of water at the room temperature. The experiment used stainless steel SS304 as a metallic material dipped in hot water at 288° C. including each of various impurities, and measured the average crack growth rate of the metallic material and the conductivity of each aqueous impurity solution at the room temperature. Impurities used in the experiment include $H_2SO_4$, $Na_2CO_3$, NaOH, NaCl, and $NaHSO_4$.

Although it is shown from the graph of FIG. 2 that the average crack growth rate increases with the increase in th conductivity of aqueous solution at the room temperature (i.e., with the increase in the impurity concentration in the aqueous solution), their correlation was not clear, nor was it known the relation between the conductivity of aqueous solution at high temperature (288° C.) and the average crack growth rate.

Figure 13:
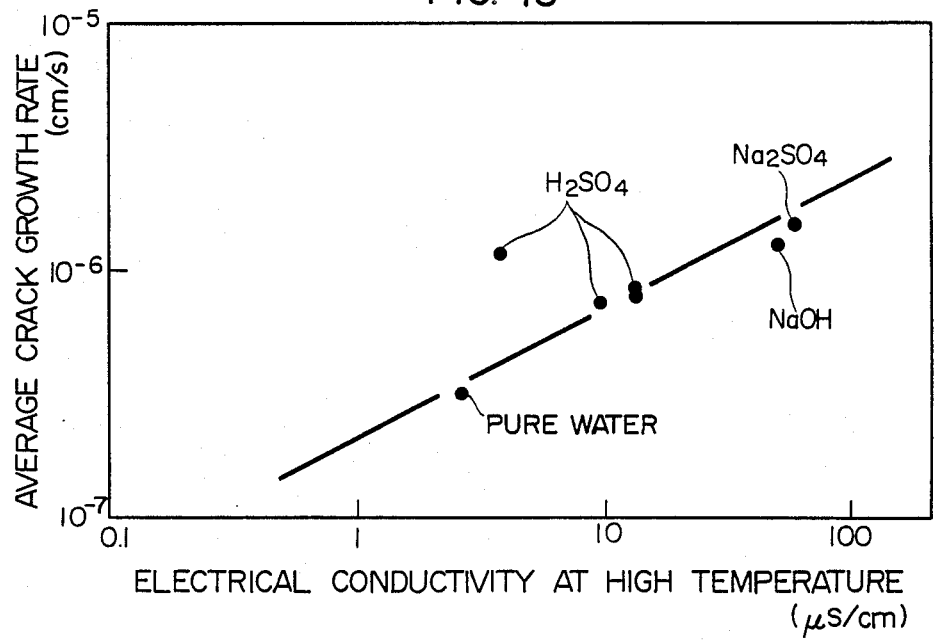
FIG. 13 is a graph showing the relation of the average crack growth rate and the conductivity of an aqueous impurity solution at a high temperature measured by application of the present invention.

An experiment was conducted to measure the conductivity of aqueous solution at high temperature (288° C.) using the inventive impedance analyzer in place of the aqueous solution conductivity at the room temperature. FIG. 13 shows the relation between the average crack growth rate and the conductivity of aqueous solution at 288° C. based on this experiment. As shown clearly by the graph of FIG. 13, it was revealed at the first time that the average crack growth rate of a metallic material in hot aqueous solution is proportional to the square root of the conductivity of the hot aqueous solution.

Accordingly, by measuring the conductivity of hot aqueous solution, the average crack growth rate of a metallic material can be inferred, and therefore the influence of impurities in hot water on intergranular stress corrosion cracking of metallic materials can be estimated accurately, whereby the reliability of plant operation can be improved. From this viewpoint, the value of $K^{\frac{1}{2}}$ may be read out on the display unit through the calculation using the value of K obtained in step 130 in the foregoing embodiment.

According to this invention, the frequency sweep range for the a.c. application voltage used in the electrode impedance analysis can be reduced to about $1/10^5$, i.e., from the conventional range of 1 Hz–10 MHz to the range of 1 kHz–100 kHz. This enables electrode impedance analysis in hot water. The ascensive shift of the lowest necessary frequency from 1 Hz to 1 kHz results in a drastic reduction in the measurement time necessary for an analytical cycle from about 15 minutes in the conventional method to around one second. The highest necessary frequency is lowered from 1 MHz to 100 kHz, and this eliminates the need of counternoise measure which has been indispensable for the analysis using a frequency as high as 1 MHz. Consequently, the measuring apparatus can be simplified, and the electrode impedance can be analyzed with the inexpensive analyzer and yet in enhanced accuracy.

We claim:

1. A method of analyzing separately the polarization resistance of a pair of measuring electrodes dipped in liquid and the solution resistance of the liquid between said electrodes based on frequency characteristics of the complex a.c. impedance having an imaginary part and a real part between said electrodes measured by application of an a.c. voltages with various frequencies between said electrodes, said method comprising:
   a first step of measuring values of complex a.c. impedance between said electrodes at a plurality of frequencies of the electrode application voltage;
   a second step of detecting a maximum value among absolute values of the imaginary part of the measured complex a.c. impedance values and determining said maximum value to be the polarization resistance;
   a third step of detecting a maximum value among absolute values of the imaginary part of the measured complex a.c. impedance values and determining the solution resistance by subtracting said maximum value of the imaginary part from the real part of a complex a.c. impedance value pertinent to said maximum imaginary part; and
   a fourth step of calculating the electrical capacitance of said electrodes based on the electrode polarization resistance and solution resistance contained in said second and third steps and the frequency of the electrode application voltage pertinent to said maximum imaginary part, the complex a.c. impedance at least one of said application frequencies is calculated basing on said resistance values and calculated capacitance value, said maximum value of imaginary part is justified when the ratio of said calculated complex a.c. impedance value to the corresponding measured value is within a certain range, and said measured electrode polarization resistance and solution resistance are justified accordingly, and wherein said calculated value of complex a.c. impedance Z at a certain application frequency $\omega$ is evaluated as a function of the calculated electrode polarization resistance Rf, solution resistance Rs and capacitance C, independently of the temperature of said liquid, using equation: $Z = Rs + 2Rf/(1 + j\omega C Rf)$.

2. A method of analyzing separately the polarization resistance of a pair of measuring electrodes dipped in liquid and the solution resistance of the liquid between said electrodes based on frequency characteristics of the complex a.c. impedance having an imaginary part and a real part between said electrodes measured by application of an a.c. voltages with various frequencies between said electrodes, said method comprising:
   a first step of measuring values of complex a.c. impedance between said electrodes at a plurality of frequencies of the electrode application voltage;
   a second step of detecting a maximum value among absolute values of the imaginary part of the measured complex a.c. impedance values and determining said maximum value to be the polarization resistance; and
   a third step of detecting a maximum value among absolute values of the imaginary part of the measured complex a.c. impedance values and determining the solution resistance by subtracting said maximum value of the imaginary part from the real part of a complex a.c. impedance value pertinent to said maximum imaginary part, an wherein said second step further calculates the reciprocal of said calculated electrode polarization resistance as a value indicative of the corrosion rate of said electrodes.

3. A method of analyzing separately the polarization resistance of a pair of measuring electrodes dipped in liquid and the solution resistance of the liquid between said electrodes based on frequency characteristics of the complex a.c. impedance between said electrodes measured by application of an a.c. voltages with various frequencies between said electrodes, said method comprising:
   a first step of measuring values of complex a.c. impedance between said electrodes at a plurality of frequencies of the electrode application voltage;
   a second step of detecting a maximum value among absolute values of an imaginary part of the measured complex a.c. impedance values and determining said maximum value to be the polarization resistance, and
   a third step of detecting a maximum value among absolute values of an imaginary part of the measured complex a.c. impedance values and determining the solution resistance by subtracting said maximum value of the imaginary part from a real part of a complex a.c. impedance value pertinent to said maximum imaginary part, said third step further including calculating the electrical conductivity of said liquid by multiplying a constant related to said electrodes by the reciprocal of said calculated solution resistance and further calculates the square root of electrical conductivity of said liquid as a value indicative of the average crack growth rate of a vessel containing said liquid.

4. An apparatus for analyzing electrode impedance comprising:

a pair of measuring electrodes dipped in liquid;

means for applying an a.c. voltage between said electrodes;

frequency control means for varying at intervals the frequency of said a.c. application voltage;

means for measuring the current and voltage between said electrodes at each application frequency;

analysis means for analyzing values of complex a.c. impedance between said electrodes at frequencies set by said frequency control means based on current values and voltage values measured at the respective frequencies; and computational means for calculating the electrode polarization resistance and solution resistance of said liquid biasing on the complex a.c. impedance values provided by said analysis means, said computational means detecting a maximum value among absolute values of imaginary part of the complex a.c. impedance values, said maximum value being determined to be the electrode polarization resistance, and determining the solution resistance by subtracting said maximum value from a real part of complex a.c. impedance pertinent to said maximum imaginary part;

wherein said computational means calculates the capacitance of said electrodes basing on the calculated electrode polarization resistance and solution resistance and the application frequency pertinent to said maximum imaginary part, calculates the complex a.c. impedance at least one of said application frequencies, justifies said maximum value when the ratio of the calculated value of complex a.c. impedance to the corresponding measured value is within a certain range, and outputting the values of electrode polarization resistance and solution resistance, and wherein said computational means calculates the complex a.c. impedance value Z at a certain application frequency $\omega$ as a function of the calculated electrode polarization resistance Rf, solution resistance Rs and capacitance C, independently of the temperature of said liquid, using equation: $Z = Rs + 2Rf/C1 + j\omega C Rf)$.

5. An apparatus for analyzing electrode impedance comprising:

a pair of measuring electrodes dipped in liquid;

means for applying an a.c. voltage between said electrodes;

frequency control means for varying at intervals the frequency of said a.c. application voltage;

means for measuring the current and voltage between said electrodes at each application frequency;

analysis for analyzinq values of complex a.c. impedance between said electrodes at frequencies set by said frequency control means based on current values and voltage values measured at the respective frequencies; and computational means for calculating the electrode polarization resistance and solution resistance of said liquid biasing on the complex a.c. impedance values provided by said analysis means, said computational means detecting a maximum value among absolute values of imaginary part of the complex a.c. impedance values, said maximum value being determined to be the electrode polarization resistance, and determining the solution resistance by subtracting said maximum value from a real part of complex a.c. impedance pertinent to said maximum imaginary part; and wherein said computational means calculates the reciprocal of the calculated electrode polarization resistance as a value indicative of the corrosion rate of said electrodes.

6. An apparatus for analyzing electrode impedance comprising:

a pair of measuring electrodes dipped in liquid;

means for applying an a.c. voltage between said electrodes;

frequency control means for varying at intervals the frequency of said a.c. application voltage;

means for measuring the current and voltage between said electrodes at each application frequency;

analysis means for analyzing values of complex a.c. impedance between said electrodes at frequencies set by said frequency control means based on current values and voltage values measured at the respective frequencies; and computational means for calculating the electrode polarization resistance and solution resistance of said liquid basing on the complex a.c. impedance values provided by said analysis means, said computational means detecting a maximum value among absolute values of imaginary part of the complex a.c. impedance values, said maximum value being determined to be the electrode polarization resistance, and determining the solution resistance by subtracting said maximum value from a real part of complex a.c. impedance pertinent to said maximum imaginary part, wherein said computational means further calculates the electrical conductivity of said liquid by multiplying a constant related to said electrodes to the reciprocal of the calculated solution resistance, and wherein said computational means calculates the root square of the electrical conductivity of said liquid as a value indicative of the average crack growth rate of a vessel containing said liquid.

7. A method of analyzing separately the polarization resistance of a pair of measuring electrodes dipped in water heated to a temperature between about 200° C. and 300° C. and the solution resistance of the liquid between said electrodes based on frequency characteristics of the complex a.c. impedance having an imaginary part and a real part between said electrodes measured by application of an a.c. voltages with various frequenciss between said electrodes, said method comprising:

a first step of measuring values of complex a.c. impedance between said electrodes at a plurality of frequencies of the electrode application voltage;

a second step of detecting a maximum value among absolute values of the imaginary part of the measured complex a.c. impedance values and determining said maximum value to be the polarization resistance, and a third step of detecting a maximum value among absolute values of the imaginary part of the measured complex a.c. impedance values and determining the solution resistance by subtracting said maximum value of the imaginary part from the real part of a complex a.c. impedance value pertinent to said maximum imaginary part.

8. An apparatus for analyzing electrode impedance comprising:
a pair of measuring electrodes dipped in water heated to a temperature between about 200° C. and 300° C.;
means for applying an a.c. voltage between said electrodes;
frequency control means for varying at intervals the frequency of said a.c. application voltage;
means for measuring the current and voltage between said electrodes at each application frequency;
analysis means for analyzing values of complex a.c. impedance between said electrodes at frequencies set by said frequency control means based on current values and voltage values measured at the respective frequencies; add computational means for calculating the electrode polarization resistance and solution resistance of said liquid biasing on the complex a.c. impedance values provided by said analysis means, said computational means detecting a maximum value among absolute values of imaginary part of the complex a.c. impedance values, said maximum value being determined to be the electrode polarization resistance, and determining the solution resistance by subtracting said maximum value from a real part of complex a.c. impedance pertinent to said maximum imaginary part.

* * * * *